(12) United States Patent
Min et al.

(10) Patent No.: US 8,199,508 B2
(45) Date of Patent: Jun. 12, 2012

(54) HEAT DISSIPATION DEVICE

(75) Inventors: Xu-Xin Min, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 339 days.

(21) Appl. No.: 12/503,021

(22) Filed: Jul. 14, 2009

(65) Prior Publication Data

US 2010/0259897 A1    Oct. 14, 2010

(30) Foreign Application Priority Data

Apr. 8, 2009    (CN) .......................... 2009 1 0301433

(51) Int. Cl.
*H05K 7/20* (2006.01)
*H05K 5/00* (2006.01)
*H01L 23/10* (2006.01)
*F28F 7/00* (2006.01)

(52) U.S. Cl. ........ 361/719; 361/704; 361/709; 361/711; 361/679.47; 361/679.52; 361/679.54; 165/80.2; 165/80.3; 257/706

(58) Field of Classification Search .................. 361/700, 361/704, 709, 711, 679.47, 679.52, 679.54, 361/719; 165/80.2–80.3; 257/706
See application file for complete search history.

(56) References Cited

U.S. PATENT DOCUMENTS

| | | | | |
|---|---|---|---|---|
| 5,473,510 A * | 12/1995 | Dozier, II | ....................... | 361/719 |
| 5,949,647 A * | 9/1999 | Kolman et al. | ............... | 361/700 |
| 5,978,223 A * | 11/1999 | Hamilton et al. | ............. | 361/704 |
| 6,052,285 A * | 4/2000 | Hileman | ....................... | 361/699 |
| 6,061,235 A * | 5/2000 | Cromwell et al. | ............. | 361/690 |
| 6,185,102 B1 * | 2/2001 | Shou et al. | ..................... | 361/704 |
| 6,208,515 B1 * | 3/2001 | Klein | ............................ | 361/704 |
| 6,385,044 B1 * | 5/2002 | Colbert et al. | ................ | 361/700 |
| 6,459,582 B1 * | 10/2002 | Ali et al. | ........................ | 361/704 |
| 6,477,058 B1 * | 11/2002 | Luebs et al. | .................. | 361/784 |
| 6,490,161 B1 * | 12/2002 | Johnson | ........................ | 361/704 |
| 6,532,141 B1 * | 3/2003 | Wu | .............................. | 165/80.3 |
| 6,680,848 B2 * | 1/2004 | Petit et al. | ...................... | 361/704 |
| 6,819,562 B2 * | 11/2004 | Boudreaux et al. | ........... | 361/690 |
| 6,835,072 B2 * | 12/2004 | Simons et al. | ................. | 439/66 |
| 6,892,801 B1 * | 5/2005 | Kim | .......................... | 165/104.33 |
| 6,929,484 B2 * | 8/2005 | Weiss et al. | ..................... | 439/66 |
| 6,937,474 B2 * | 8/2005 | Lee | .............................. | 361/715 |
| 6,972,958 B2 * | 12/2005 | Mayer | .......................... | 361/719 |
| 6,986,383 B2 * | 1/2006 | Hsu | .......................... | 165/104.26 |
| 7,032,305 B2 * | 4/2006 | Petit et al. | ....................... | 29/832 |
| 7,289,335 B2 * | 10/2007 | Callahan et al. | .............. | 361/803 |

(Continued)

*Primary Examiner* — Bradley Thomas
(74) *Attorney, Agent, or Firm* — Altis Law Group, Inc.

(57) ABSTRACT

A heat dissipation device dissipates heat generated by a heat-generating electronic element mounted on a top surface printed circuit board. The printed circuit board defines a plurality of first through holes. The heat dissipation device comprises a heat spreader located at a top side of the printed circuit board. The heat spreader defines a plurality of second through holes corresponding to the first through holes, respectively. A first heat sink is located over the heat spreader, and a plurality of second heat sinks is located at a bottom side of the printed circuit board. A plurality of heat pipes extending through the second through holes of the heat spreader and the first through holes of the printed circuit board to thermally connect the first and second heat sinks to the heat spreader.

20 Claims, 3 Drawing Sheets

U.S. PATENT DOCUMENTS

| | | | |
|---|---|---|---|
| 7,324,341 B2 * | 1/2008 | Oman | 361/700 |
| 7,508,667 B2 * | 3/2009 | Wu et al. | 361/697 |
| 7,677,299 B2 * | 3/2010 | Zheng | 165/104.26 |
| 2004/0212963 A1 * | 10/2004 | Unrein | 361/704 |
| 2005/0092465 A1 * | 5/2005 | Lin et al. | 165/104.21 |
| 2005/0135062 A1 * | 6/2005 | Kiley et al. | 361/700 |
| 2006/0039117 A1 * | 2/2006 | Lee et al. | 361/719 |
| 2007/0019381 A1 * | 1/2007 | Veh | 361/687 |
| 2007/0035931 A1 * | 2/2007 | Kuo et al. | 361/719 |
| 2007/0064396 A1 * | 3/2007 | Oman | 361/700 |
| 2007/0091578 A1 * | 4/2007 | Chang et al. | 361/719 |
| 2007/0147006 A1 * | 6/2007 | Peng | 361/709 |
| 2007/0169920 A1 * | 7/2007 | Yang | 165/104.34 |
| 2007/0171616 A1 * | 7/2007 | Peng et al. | 361/700 |
| 2007/0217162 A1 * | 9/2007 | Zhou et al. | 361/710 |
| 2008/0043479 A1 * | 2/2008 | Wang | 362/373 |
| 2008/0062649 A1 * | 3/2008 | Leng et al. | 361/700 |
| 2008/0068797 A1 * | 3/2008 | Iikubo | 361/695 |
| 2008/0121370 A1 * | 5/2008 | Luo et al. | 165/80.3 |
| 2008/0165501 A1 * | 7/2008 | Stewart et al. | 361/704 |
| 2008/0257527 A1 * | 10/2008 | Li et al. | 165/80.3 |
| 2009/0154102 A1 * | 6/2009 | Zhou et al. | 361/700 |
| 2010/0078154 A1 * | 4/2010 | Li et al. | 165/104.31 |

* cited by examiner

HEAT DISSIPATION DEVICE

BACKGROUND

1. Technical Field

The disclosure relates to heat dissipation devices and, particularly, to a heat dissipation device capable of efficiently dissipating heat generated by a heat-generating electronic component.

2. Description of Related Art

Computer electronic components, such as central processing units (CPUs), generate great amounts of heat during normal operation thereof. If the heat is not properly dissipated, it can deteriorate an operational stability of the electronic components and damage associated computer. Thus the heat must be removed quickly to ensure normal operation of these electronic components. A heat dissipation device is often attached to a top surface of a CPU to remove heat therefrom.

A conventional heat dissipation device includes a heat conducting base and a plurality of parallel fins protruding from a top surface of the base. A bottom surface of the base of the heat dissipation device contacts with a CPU mounted on a top surface of a printed circuit board. That is, the heat dissipation device is disposed at a top side of the printed circuit board. Therefore, the heat dissipation device dissipates heat generated by the CPU only from the top side of the printed circuit board, and therefore has a low heat dissipation efficiency. In addition, a bottom side space of the printed circuit board cannot be effectively used.

What is needed, therefore, is a heat dissipation device capable of efficiently dissipating heat thereby to overcome the described limitations.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION

Figure 1:
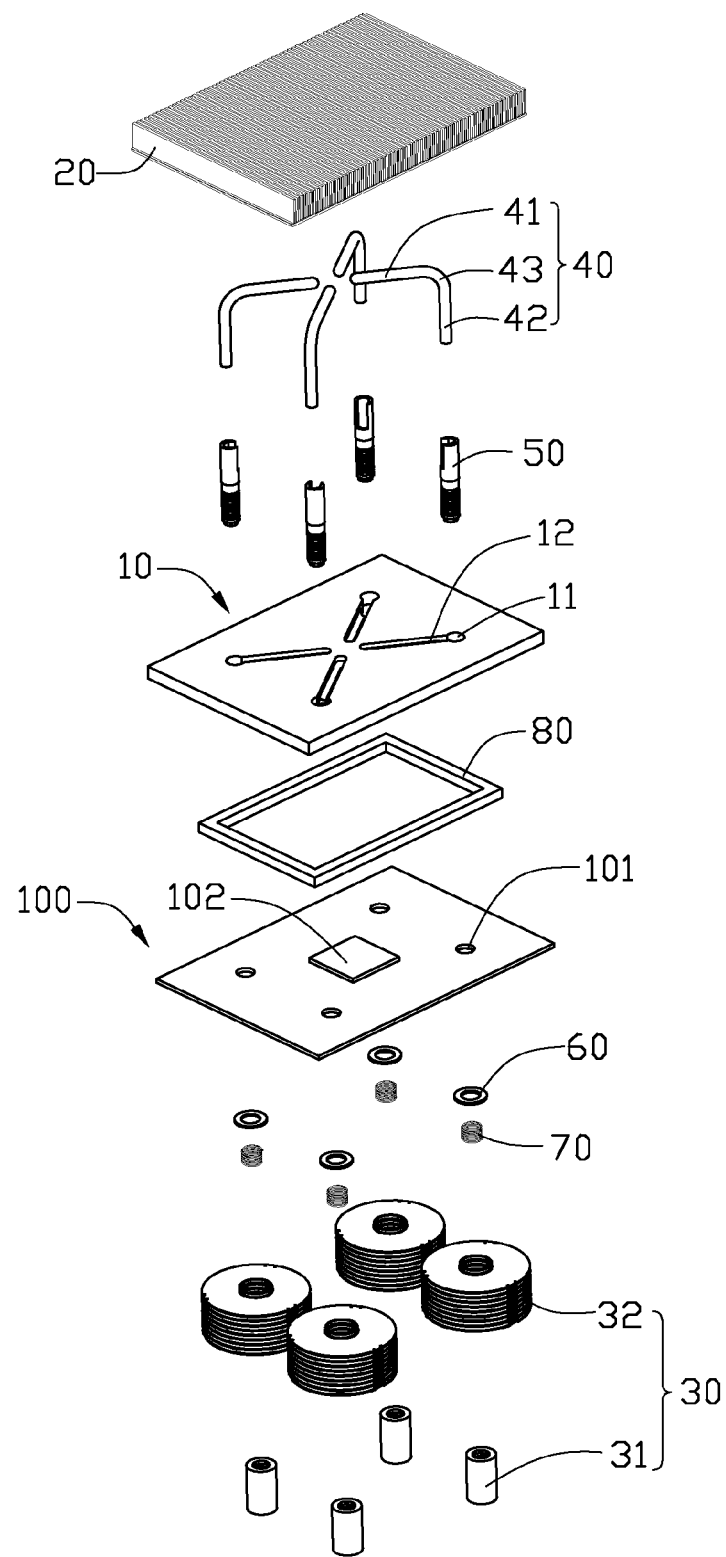
FIG. 1 is an isometric, exploded view of a heat dissipation device in accordance with an embodiment of the disclosure.
Figure 2:
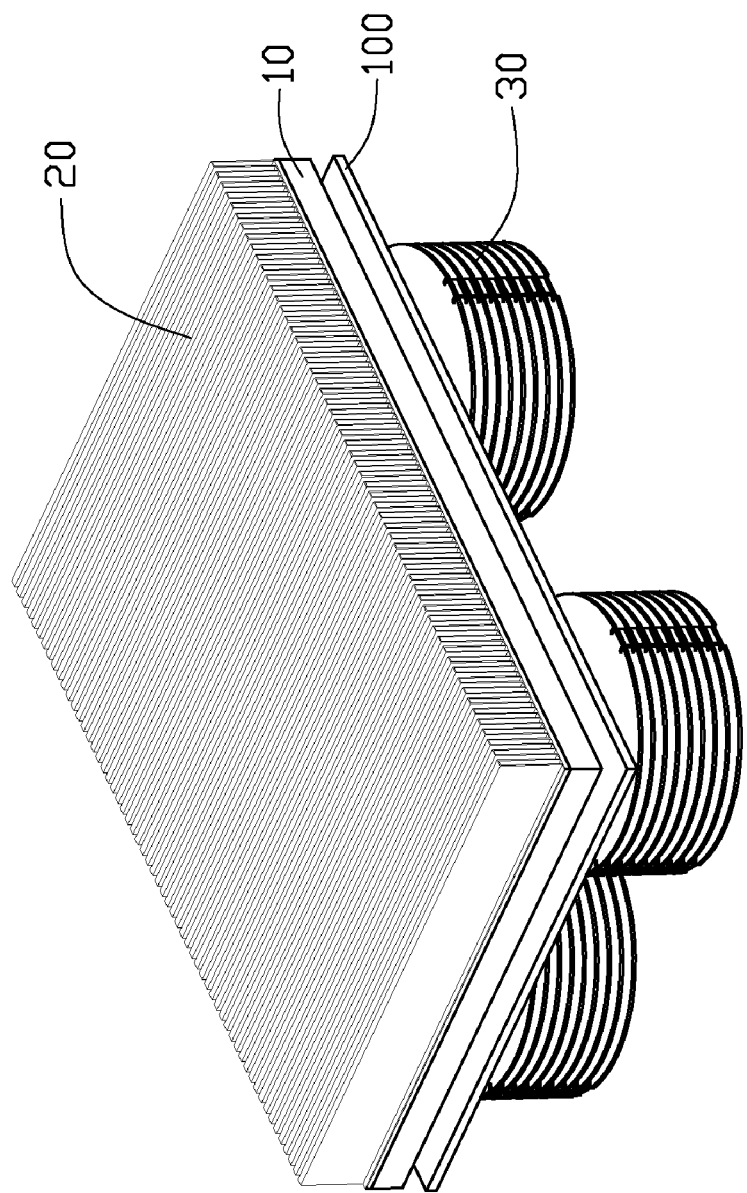
FIG. 2 is an assembled view of the heat dissipation device FIG. 1.

Referring to FIGS. 1-2, a heat dissipation device includes a heat spreader 10 configured to thermally contact with a heat-generating electronic element 102 mounted on a printed circuit board 100, a first heat sink 20 located at a top side of the heat spreader 10, four second heat sinks 30 located at a bottom side of the printed circuit board 100, and four heat pipes 40. The heat spreader 10 is a rectangular metallic plate and defines four first through holes 11, and the printed circuit board 100 defines four second through holes 101 corresponding to the four first through holes 11, respectively.

Figure 3:
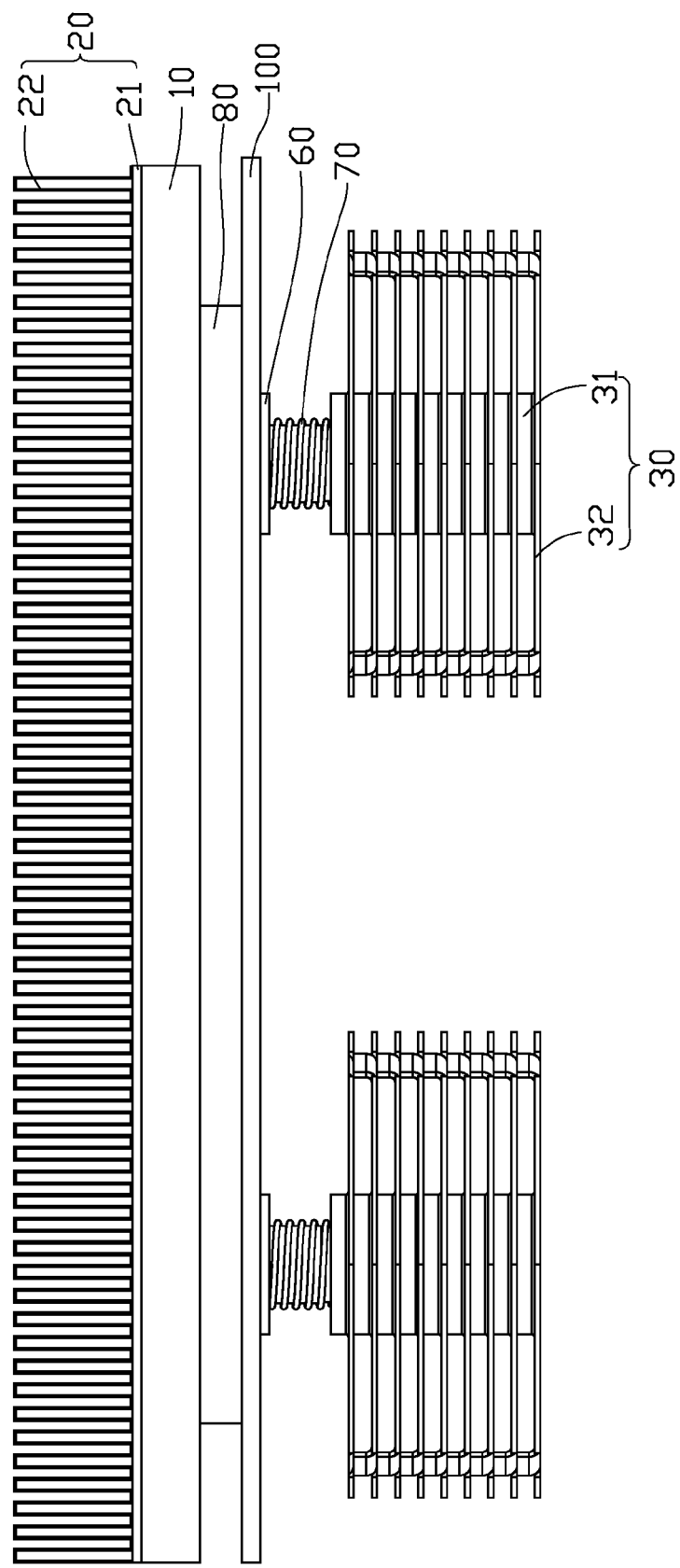
FIG. 3 is a front elevational view of the heat dissipation device shown in FIG. 2.

Referring to FIG. 3, the first heat sink 20 includes a heat conducting base plate 21 and a plurality of first fins 22 extending from a top surface of the base plate 21. The second heat sink 30 includes a heat conducting cylindrical sleeve 31 and a plurality of annular second fins 32 set around an outer surface of the sleeve 31. The second fins 32 are parallel with each other and equidistantly disposed on the outer surface of the sleeve 31 along an axis direction of the sleeve 31. A flange (not shown) extends from an inner edge of each of the second fins 32 to combine with the outer surface of the sleeve 31, whereby the second fins 32 can be easily assembled to the outer surface of the sleeve 31. In the present embodiment, the second fins 32 are welded to the outer surface of the sleeve 31. An inner screw thread (not labeled) is formed in an inner wall of the sleeve 31.

The heat pipe 40 is an inverted L-shaped tubular structure and comprises a horizontal section (i.e., heat absorbing section) 41, a vertical section (i.e., heat dissipating section) 42 and a bent connection section 43 connected between the horizontal section 41 and the vertical section 42. The horizontal section 41 of the heat pipe 40 is sandwiched between the base plate 21 of the first heat sink 20 and the heat spreader 10. The connection section 43 of the heat pipe 40 sequentially passes through the first through hole 11 of the heat spreader 10 and the second through hole 101 of the printed circuit board 100 to enable the vertical section 12 to be located below the bottom side of the printed circuit board 100. The vertical section 42 of the heat pipe 40 can be directly or indirectly thermally connected with the corresponding second heat sink 30, as discussed in details herebelow.

In the present embodiment, the vertical section 42 of the heat pipe 40 thermally connects with the corresponding second heat sink 30 via a thermally conductive tube 50. Specifically, the vertical section 42 of the heat pipes 40 is inserted in and welded to an inner wall of the tube 50. An outer screw thread (not labeled) is formed on an outer surface of the tube 50 to mate with the inner screw thread formed on the inner wall of the sleeve 31 of the second heat sink 30. Thus, the four second heat sinks 30 are thermally connected to the heat spreader 10 by the four tubes 50 welded to the four vertical sections 42 of the four heat pipes 40, in which the four tubes 50 are screwed into four sleeves 31 of four second heat sinks 30. Accordingly, the first heat sink 20, the four second heat sinks 30 and the heat spreader 10 are thermally connected to each other via the four heat pipes 40.

It is understood that the number of the first heat sink 20, the second heat sinks 30 and the heat pipes 40 can be varied, so long as the first and second heat sinks 20, 30 are respectively located at different sides of the printed circuit board 100 and can be thermally connected together by the heat pipes 40. In addition, the tubes 50 can be omitted; in this situation, for example, a plurality of screw threads is formed on an outer surface of the vertical section 42 of the heat pipe 40 to mate with the screw threads of the sleeve 31 of the second heat sink 30. It is noted that an engaging manner between the vertical section 42 of the heat pipe 40 and the second heat sink 30 can be changed so long as the heat pipe 40 can be thermally connected with the second heat sink 30. Furthermore, the heat spreader 10 can be a vapor chamber which can uniformly absorb the heat generated by the electronic component 102 and quickly transfer the absorbed heat to the horizontal sections 41 of the heat pipes 40 and the base plate 21 of the first heat sink 20.

In order to ensure a top surface of the heat spreader 10 to tightly combine with a bottom surface of the base plate 21 of the first heat sink 20, the top surface of the heat spreader 10 defines four straight grooves 12 to receive the four horizontal sections 41 of the four heat pipes 40, respectively. Each of the four grooves 12 communicates a corresponding first through hole 11 and locates at an inner side of the corresponding first through hole 11. When the connection sections 43 of the four heat pipes 40 respectively pass through the four first through holes 11, the four horizontal sections 41 are received in the four grooves 12, respectively, whereby the four horizontal sections 41 and the top surface of the heat spreader 10 are coplanar. Thus, the base plate 21 of the first heat sink 20 simultaneously thermally engages with the four horizontal sections 41 of the four heat pipes 40 and the top surface of the heat spreader 10, and heat absorbed by the heat spreader 10 can be transferred to the first heat sink 20 via two paths, that is, via the horizontal sections 41 of the heat pipes 40 and the top surface of the heat spreader 10.

In the illustrated embodiment, the heat-generating electronic element 102 is located at a central portion of the printed circuit board 100; the top surface of the heat spreader 10 defines the four grooves 12 receiving the four horizontal sections 41 of the four heat pipes 40 therein. An arrangement of the four heat pipes 40 is detailedly discussed in the following. Two of the four heat pipes 40 are arranged in a first plane, another two of the four heat pipes 40 are arranged in a second plane, and the first plane crosses the second plane. The four horizontal sections 41 of the heat pipes 40 are in a same horizontal plane, and the four vertical sections 42 of the heat pipes 40 are parallel to each other. Four free ends of the four horizontal sections 41 of the four heat pipes 40 are close to each other, around a central portion of the top surface of the heat spreader 10. The four grooves 12 defined on the top surface of the heat spreader 10 are arranged corresponding to the arrangement of the four horizontal sections 41 of the four heat pipes 40. Due to this arrangement, heat generated by the heat-generating electronic element 102 is absorbed by the central portion of the heat spreader 10 and dispersed by the four horizontal sections 41 of the four heat pipes 40 from the free ends outwardly to fixed ends thereof. The fixed ends of the four horizontal sections 41 are in connection with the connection sections 43 of the heat pipes 40. The heat is dispersed along the four horizontal sections 41, which are extended along diagonals of the heat spreader 10; thus, the heat cannot congregate at the central portion of the heat spreader 10.

In order to accommodate various printed circuit boards 100 with various thicknesses, a length of a combination of the vertical section 42 of the heat pipe 40 and the tube 50 is larger than that of the sleeve 31 of the second heat sink 30. In addition, a gasket 60 is applied between the printed circuit board 100 and the sleeve 31 of the second heat sink 30 to ensure the second heat sink 30 can be reliably secured to printed circuit board 100. Preferably, a helical spring 70 is compressed between the gasket 60 and a top surface of the sleeve 31 of the second heat sink 30 to make the force acting on the electronic component 102 by the heat spreader 10 be more uniformly distributed over the electronic component 102. To further ensure an even engagement between the heat spreader 10 and the electronic component 102, a spacing ring 80 made of elastic material such as rubber is provided between the heat spreader 10 and the printed circuit board 100, to thereby ensure the heat spreader 10 and the printed circuit board 100 are stably engaged with each other. In the present embodiment, the spacing ring 80 surrounds the four vertical sections 42 of the four heat pipes 40 and contacts with an outer sidewall of each of the four vertical sections 42.

In assembly, the four vertical sections 42 of the four heat pipes 40 extend through the four first through holes 11 of the heat spreader 10, and the four horizontal sections 41 are received in the four grooves 12 of the heat spreader 10 and welded to the heat spreader 10. The spacing ring 80 is set around the four vertical sections 42 of the four heat pipes 40, and the four vertical sections 42 are brought to pass through the four second through holes 101 of the printed circuit board 100, whereby the spacing ring 80 is sandwiched between the heat spreader 10 and the printed circuit board 100. The four tubes 50 are welded to the four vertical sections 42 of the four heat pipes 40. The four gaskets 60, the four springs 70 and the four second heat sinks 30 are sequentially assembled to the four vertical sections 42 of the four heat pipes 40, thereby completing the assembly of the heat dissipation device.

In the above-described embodiment, the heat dissipation device has separate heat sinks, e.g., the first heat sink 20 and four second heat sinks 30, which can be positioned two different sides of the printed circuit board 100. That is, the first heat sink 20 is positioned at the top side of the printed circuit board 100 where the heat-generating electronic element 102 mounted, and the four heat sinks 30 are positioned at the bottom side of the printed circuit board 100 at a region outside heat-generating electronic element 102. Thus, the two sides of the printed circuit board 100 can be efficiently used. When the heat-generating electronic element 102 works, heat generated by the heat-generating electronic element 102 can be simultaneously dissipated by the first and second heat sinks 20, 30, thereby greatly improving heat dissipation efficiency.

It is to be understood, however, that even though numerous characteristics and advantages of the present embodiments have been set forth in the foregoing description, together with details of the apparatus and function of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

The invention claimed is:

1. A heat dissipation device for dissipating heat generated by a heat-generating electronic element mounted on a top surface of a printed circuit board, the printed circuit board defining a plurality of first through holes, the heat dissipation device comprising:
   a heat spreader for being arranged at a top side of the printed circuit board, the heat spreader defining a plurality of second through holes corresponding to the first through holes, respectively;
   a first heat sink located over the heat spreader;
   a plurality of second heat sinks for being arranged at a bottom side of the printed circuit board;
   a plurality of gaskets and helical springs for being applied between the printed circuit board and the second heat sinks; and
   a plurality of heat pipes for extending through the second through holes of the heat spreader and the first through holes of the printed circuit board to thermally connect the first and second heat sinks to the heat spreader, each of the heat pipes extending through a corresponding gasket and helical spring to engage in a corresponding one of the second heat sinks with the corresponding gasket abutting against the bottom side of the printed circuit board and the corresponding helical spring compressed between the corresponding gasket and second heat sink when the heat dissipation device is assembled on the heat-generating electronic element.

2. The heat dissipation device of claim 1, wherein the first heat sink comprises a base plate contacting a top surface of the heat spreader and a plurality of fins extending upwardly from a top surface of the base plate.

3. The heat dissipation device of claim 2, wherein each of the second heat sinks comprises a sleeve and a plurality of fins attached to an outer surface of the sleeve, and the fins of the second heat sink are annular and stacked along an axial direction of the sleeve.

4. The heat dissipation device of claim 3, wherein each of the heat pipes comprises a horizontal section, a vertical section and a connection section connected between the horizontal section and the vertical section, the horizontal section is sandwiched between a bottom surface of the base plate of the first heat sink and the top surface of the heat spreader, the vertical section sequentially passes through one of the second through holes of the heat spreader, a corresponding one of the first through holes of the printed circuit board, and the corresponding gasket and helical spring to engage with the sleeve of the corresponding one of the second heat sinks.

5. The heat dissipation device of claim 4, further comprising a plurality of tubes, the vertical section of each of the heat pipes is inserted into a corresponding one of the tubes, and the vertical section of each of the heat pipes engages with the sleeve of the corresponding one of the second heat sinks via the corresponding one of the tubes.

6. The heat dissipation device of claim 5, wherein an inner screw thread is formed on an inner wall of the sleeve of each of the second heat sinks, an outer surface of the corresponding one of the tubes forms an outer screw thread, and the corresponding one of the tubes is screwed in the sleeve of the corresponding one of the second heat sinks.

7. The heat dissipation device of claim 4, wherein the top surface of the heat spreader defines a plurality of grooves receiving the horizontal sections of the heat pipes therein, respectively.

8. The heat dissipation device of claim 7, wherein each of the grooves communicates with a corresponding second through hole of the heat spreader and locates at an inner side of the corresponding second through hole.

9. The heat dissipation device of claim 7, wherein the horizontal sections of the heat pipes and the top surface of the heat spreader are coplanar, and the base plate of the first heat sink simultaneously thermally engages with the horizontal sections of the heat pipes and the top surface of the heat spreader.

10. The heat dissipation device of claim 4, wherein a spacing ring is sandwiched between the heat spreader and the printed circuit board and surrounds the vertical sections of the heat pipes.

11. A heat dissipation device comprising:
a printed circuit board defining a first through hole;
a heat spreader located at a top side of the printed circuit board, the heat spreader defining a second through hole corresponding to the first through hole;
a first heat sink located over the heat spreader, the first heat sink comprising a base plate contacting a top surface of the heat spreader and a plurality of fins extending upwardly from a top surface of the base plate;
a second heat sink located at a bottom side of the printed circuit board;
a gasket and a helical spring applied between the printed circuit board and the second heat sink, the gasket abutting against the bottom side of the printed circuit board, and the helical spring elastically compressed between the gasket and the second heat sink; and
a heat pipe thermally connecting the first and second heat sinks to the heat spreader, the heat pipe comprising a heat absorbing section, a heat dissipating section and a connection section connected between the heat absorbing section and the heat dissipating section, wherein the heat absorbing section is sandwiched between a bottom surface of the base plate of the first heat sink and the top surface of the heat spreader, the connection section sequentially passes through the heat spreader and the printed circuit board, the heat dissipating section is below the bottom side of printed circuit board, and the heat dissipating section extends through the gasket and the helical spring to connect the second heat sink.

12. The heat dissipation device of claim 11, wherein the second heat sink comprises a sleeve and a plurality of fins attached to an outer surface of the sleeve, the heat dissipating section of the heat pipe being engaged in the sleeve, the fins of the second heat sink being annular and perpendicular to the fins of the first sink.

13. The heat dissipation device of claim 11, wherein the top surface of the heat spreader defines a groove receiving the heat absorbing section of the heat pipe therein.

14. The heat dissipation device of claim 13, wherein the heat absorbing section of the heat pipe and the top surface of the heat spreader are coplanar, whereby the base plate of the first heat sink simultaneously thermally engages with the heat absorbing section of the heat pipe and the top surface of the heat spreader.

15. A heat dissipation device for dissipating heat generated by a heat-generating electronic element mounted on a printed circuit board, the heat dissipation device comprising:
a heat spreader for absorbing heat from the heat-generating electronic element, the heat spreader defining a through hole therein;
a first heat sink arranged at a first side of the heat spreader;
a second heat sink arranged at a second side of the heat spreader opposite to the first side;
a gasket and a helical spring applied between the first heat sink and the second heat sink, the helical spring elastically abutting between the gasket and the second heat sink; and
a heat pipe comprising a heat absorbing section, a heat dissipating section and a connection section interconnecting the heat absorbing section and heat dissipating section, the heat absorbing section being sandwiched between the first heat sink and the heat spreader, the connection section extending through the through hole of the heat spreader, the heat dissipating section extending through the gasket and the helical spring and connecting to the second heat sink.

16. The heat dissipation device of claim 15, wherein the first heat sink and the second heat sink are located at opposite sides of the printed circuit board with the connection section of the heat pipe extending through the printed circuit board when the heat dissipation device is installed on the heat-generating electronic element.

17. The heat dissipation device of claim 15, wherein the heat spreader defines a groove communicating with the through hole, the heat absorbing section of the heat pipe being received in the groove, the first heat sink simultaneously contacting the heat spreader and the heat absorbing section of the heat pipe.

18. The heat dissipation device of claim 15, further comprising a tube, the heat dissipating section of the heat pipe being inserted in the tube, the second heat sink being mounted around the tube.

19. The heat dissipation device of claim 18, wherein the second heat sink comprises a sleeve and a plurality of annular fins stacked along an axial direction of the sleeve, the tube being threadedly engaged in the sleeve of the second heat sink.

20. The heat dissipation device of claim 15, wherein heat pipe is substantially L-shaped, the heat absorbing section being substantially parallel to the heat spreader, the heat dissipating section being substantially perpendicular to the heat spreader.

* * * * *